United States Patent [19]
Seo

[11] Patent Number: 6,114,886
[45] Date of Patent: Sep. 5, 2000

[54] OUTPUT BUFFER CIRCUIT

[75] Inventor: Sung Hwan Seo, Seoul, Rep. of Korea

[73] Assignee: Hyundai Electronics Industries Co., Ltd., Ichon-shi, Rep. of Korea

[21] Appl. No.: 09/294,400

[22] Filed: Apr. 20, 1999

[30] Foreign Application Priority Data

Apr. 21, 1998 [KR] Rep. of Korea ..................... 98-14193

[51] Int. Cl.$^7$ ................ H03B 1/00; H03K 3/00
[52] U.S. Cl. .......................................................... 327/112
[58] Field of Search ................................. 327/108, 112, 327/379, 389; 326/85, 87, 91, 21, 26, 27

[56] References Cited

U.S. PATENT DOCUMENTS

| | | | |
|---|---|---|---|
| 5,638,326 | 6/1997 | Hollmer et al. | 365/185.2 |
| 5,719,807 | 2/1998 | Sali et al. | 365/185.25 |
| 5,723,992 | 3/1998 | Yin et al. | 327/112 |
| 5,831,458 | 11/1998 | Nakagawa | 327/108 |
| 5,877,638 | 3/1999 | Lin | 327/108 |
| 5,926,056 | 7/1999 | Morris et al. | 327/333 |
| 5,929,668 | 7/1999 | Kim | 327/112 |

*Primary Examiner*—My-Trang Nuton
*Attorney, Agent, or Firm*—Pennie & Edmonds LLP

[57] ABSTRACT

A preset signal generation circuit comprises a transfer gate for transferring a previously sensed data according to a delayed preset enable signal before the preset signal generation circuit is enabled; delay means for outputting a delayed preset enable signal by delaying a preset enable signal; latch means for storing an output signal of the transfer gate; a first logic element for combining an inverted signal of the delayed preset enable signal and an inverted output signal of the latch means; a first drive means for outputting a source voltage or a ground voltage according to an output signal of the first logic element; a first preset signal control means for controlling an output of the first drive means by having as inputs the preset enable signal and the previously sensed data; a second logic element for combining the delayed preset enable signal and an inverted output signal of the latch means; a second drive means for outputting the source voltage or ground voltage according to an output of the second logic element; and a second preset signal control means for controlling an output of the second drive means by having as inputs the preset enable signal and the previously sensed data.

17 Claims, 8 Drawing Sheets

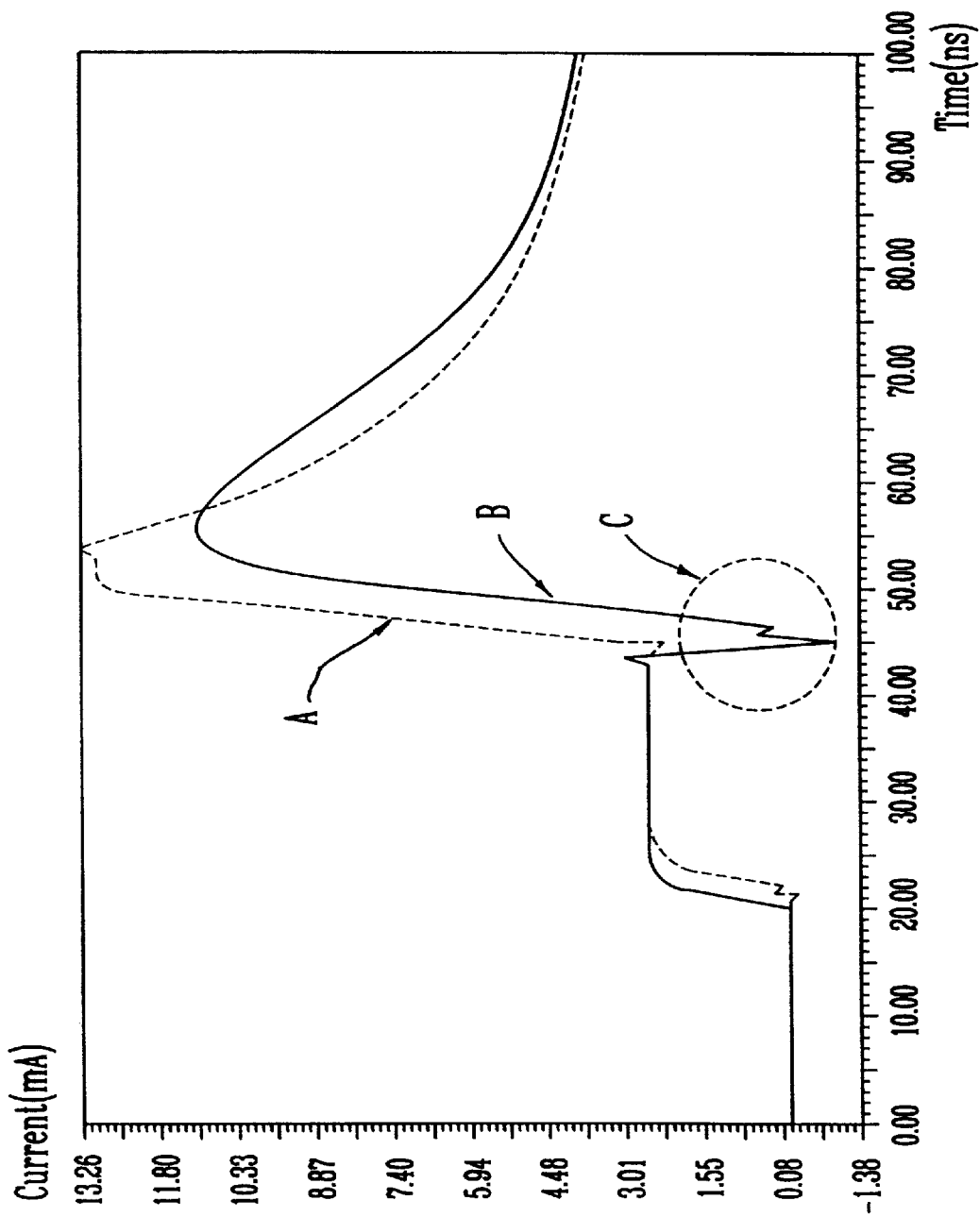

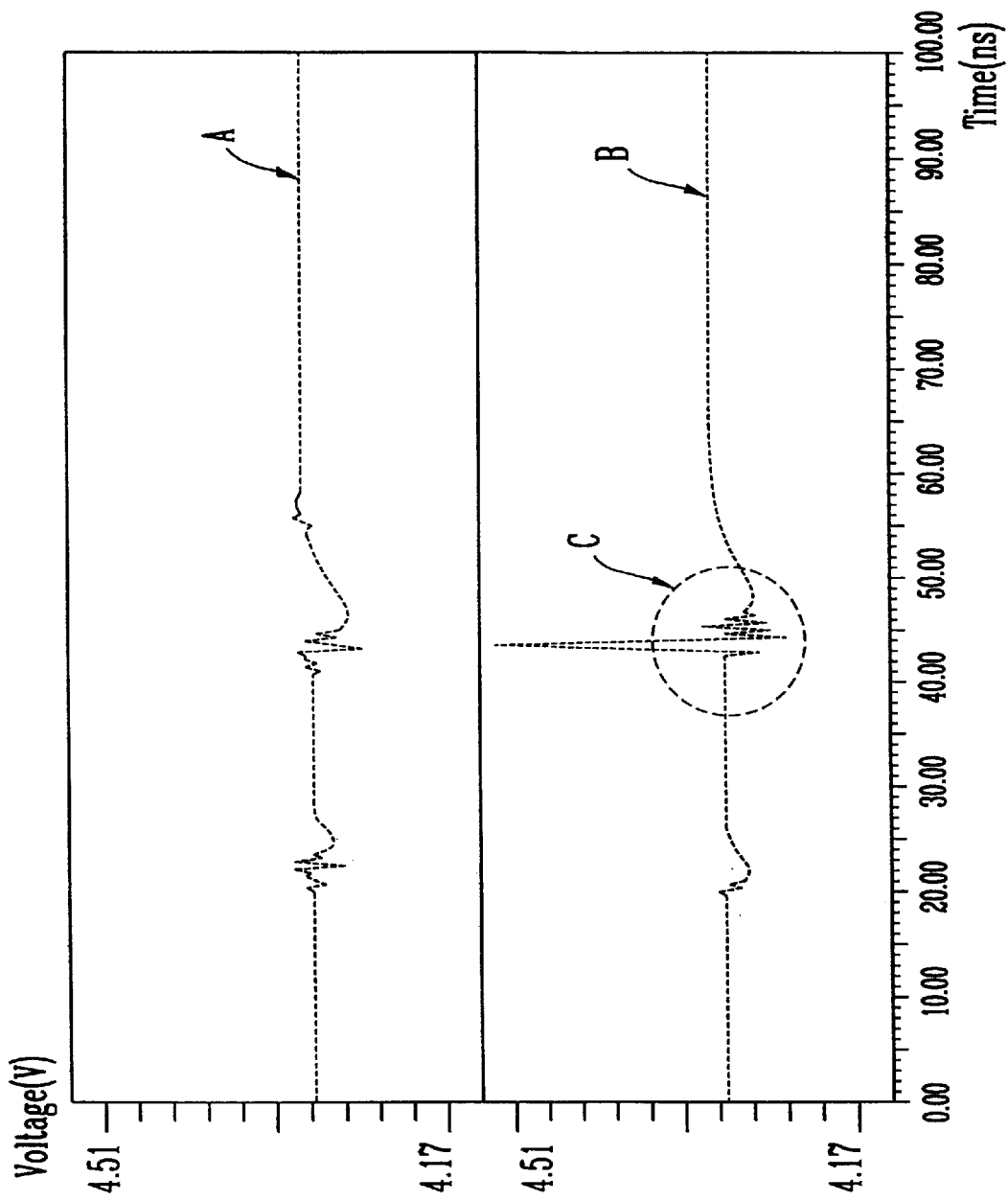

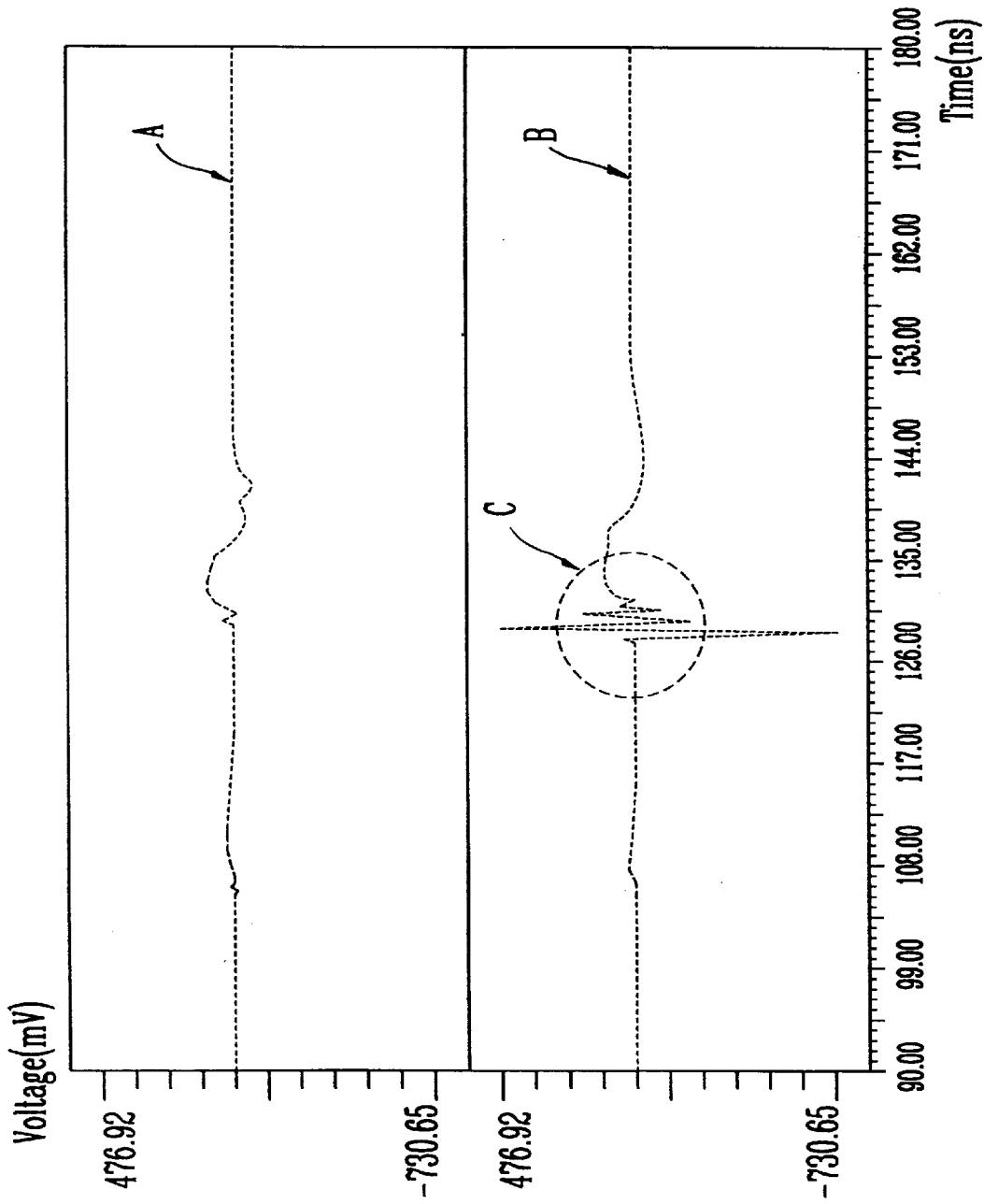

OUTPUT BUFFER CIRCUIT

BACKGROUND OF THE INVENTION

1. Field of the Invention

The present invention relates to an output buffer circuit and, in particular, to an output buffer circuit which can improve noise and output speed of data by adjusting a preset signal generated from a preset signal generation circuit.

2. Background of the Invention

In general, a preset type output buffer consists of an output driver circuit and a preset signal generation circuit. The output driver circuit has preset pull up and pull down transistors and main pull up and pull down transistors. The preset pull up and pull down transistors are driven by the preset signal generation circuit. In the output buffer having such structure, after a potential of an output node is precharged to some degree by turning on of the preset pull up and pull down transistors, the main pull up and pull down transistors are driven so that a resultant data is output through an output terminal.

A conventional preset signal generation circuit will be described below with reference to FIGS. 1a and 1b.

FIGS. 1a and 1b are timing diagrams of a conventional output buffer and a preset signal generation circuit of the output buffer, respectively, however, only the timing diagrams of pull down procedure is shown.

As shown in FIG. 1a, if an address ADD is changed at t1 time point to read data stored in a memory cell, an address transition detector ATD generates an ATD pulse having high state. The address transition detector ATD is used for detecting the address at the time of read operation of memory cell, and the read speed of data can be improved and the power consumption can be reduced by using the ATD pulse generated by the address transition detector ATD. At this time, the preset signal PRESET generated by the preset signal generation circuit becomes high state so that the preset pull up or pull down transistor is turned on according to the state of previously sensed data so as to precharge the potential of the output node and then turned off. Thereafter, the main pull up and pull down transistors are turned on according to a main pull up and down transistor drive signal MAIN so that the resultant data is output through the output terminal.

A procedure of generating the preset signal will be described with reference to FIG. 1b.

A preset enable signal OPB is generated by using the ATD pulse, has a pulse width same as that of ATD pulse, and becomes high state at the time of driving the preset signal generation circuit. An input signal SOUTb is an inversed data of previously sensed data.

First, the operation of the preset signal generation circuit in case where the level of the previously sensed data is high will be described. At this time, since the input signal SOUTb becomes low state, the output signal of a NOR gate G1 becomes low state. Accordingly, a first PMOS transistor P1 is turned on while a first NMOS transistor N1 is turned off so that a source voltage is supplied through the first PMOS transistor P1 and finally an output signal pup becomes high state. On the other hand, since an output of a NAND gate G2 also becomes low state, a second PMOS transistor P2 is turned on while a second NMOS transistor N2 is turned off so that the source voltage Vcc is supplied through the second PMOS transistor P2 and finally an output signal pdp becomes high state.

In case where the previously sensed data is low state, the input signal SOUTb becomes high state and the output of the NOR gate G1 becomes high state. Accordingly, the first PMOS transistor P1 is turned off while the first NMOS transistor N1 is turned on so that an electric current pass occurs to a ground terminal Vss. Finally the output signal pup becomes low state. In addition, the output of the NAND gate G2 becomes high state, whereby the second PMOS transistor P2 is turned off while the second NMOS transistor N2 is turned on so that an electric current pass occurs to the ground terminal Vss. Finally the output signal becomes low state.

Thereafter, the output signals pup and pdp of such preset signal generation circuit is input to an output driver. Then the preset enable signal OPB becomes low state so that the preset signal generation circuit is disabled, and at this time of t2 in FIG. 1a, the main pull up and pull down transistor drive signal MAIN becomes high state so that the resultant data is output.

In case of the output buffer using such preset signal generation circuit, the preset signal generation circuit is disabled before the main pull up and pull down procedure is performed, and this has problems in that the electric current flows discontinuously at this time, a noise occurs accordingly and the data output speed is decreased.

SUMMARY OF THE INVENTION

Therefore, the object of the present invention is to provide an output buffer circuit which can prevent the discontinuous flow of electric current, improve the data output speed and improve the noise by adjusting the timing of the preset signal generation circuit by delaying the input of the enable signal of the preset signal generation circuit.

A preset type output buffer has a preset signal generation circuit, a main pull up and pull down signal generation circuit, and an output driver driven according to the output signals of the preset signal generation circuit and main pull up and pull down signal generation circuit, in which the preset signal generation circuit comprises:

a transfer gate for transferring a previously sensed data according to a delayed preset enable signal before the preset signal generation circuit is enabled;

delay means for outputting a delayed preset enable signal by delaying a preset enable signal;

latch means for storing an output signal of the transfer gate;

a first logic element for combining an inverted signal of the delayed preset enable signal and an inverted output signal of the latch means;

a first drive means for outputting a source voltage or a ground voltage according to an output signal of the first logic element;

a first preset signal control means for controlling an output of the first drive means by having as inputs the preset enable signal and the previously sensed data;

a second logic element for combining the delayed preset enable signal and an inverted output signal of the latch means;

a second drive means for outputting the source voltage or ground voltage according to an output of the second logic element; and a second preset signal control means for controlling an output of the second drive means by having as inputs the preset enable signal and the previously sensed data.

BRIEF DESCRIPTION OF THE DRAWINGS

The above object and other advantages of the present invention will become more apparent by describing in detail the preferred embodiment of the present invention with reference to the attached drawings in which:

FIGS. 6a and 6b are graphs showing the measurement of the current according to the preset signal generation circuit at the time of pull up and pull down, respectively; and FIGS. 7a and 7b are graphs showing the measurement of the degree of noise according to the preset signal generation circuit at the time of pull up and pull down, respectively.

Similar reference characters refer to similar parts in the several views of the drawings.

DETAILED DESCRIPTION OF THE INVENTION

The present invention will be described in detail below with reference to the accompanying drawings.

Figure 1A:
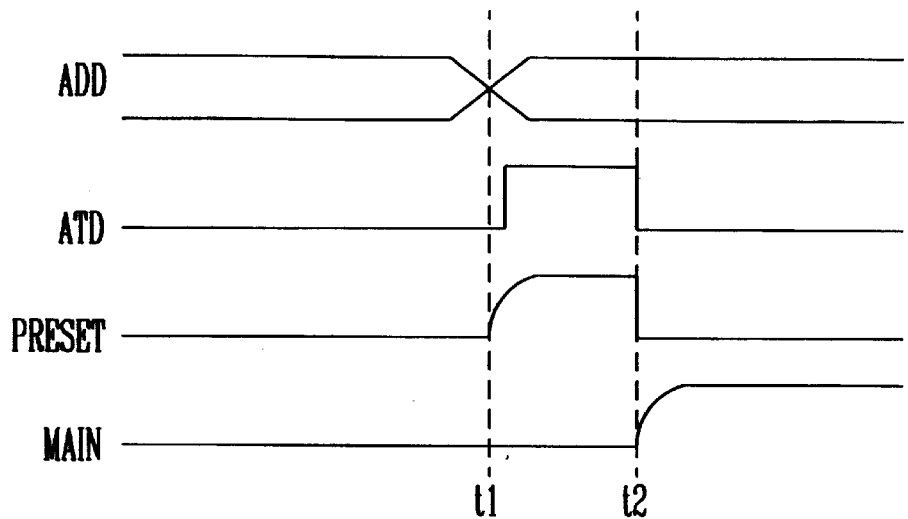
FIG. 1a and 1b are filming diagrams of a conventional output buffer and a preset signal generation circuit of the conventional output buffer, respectively.
Figure 1B:
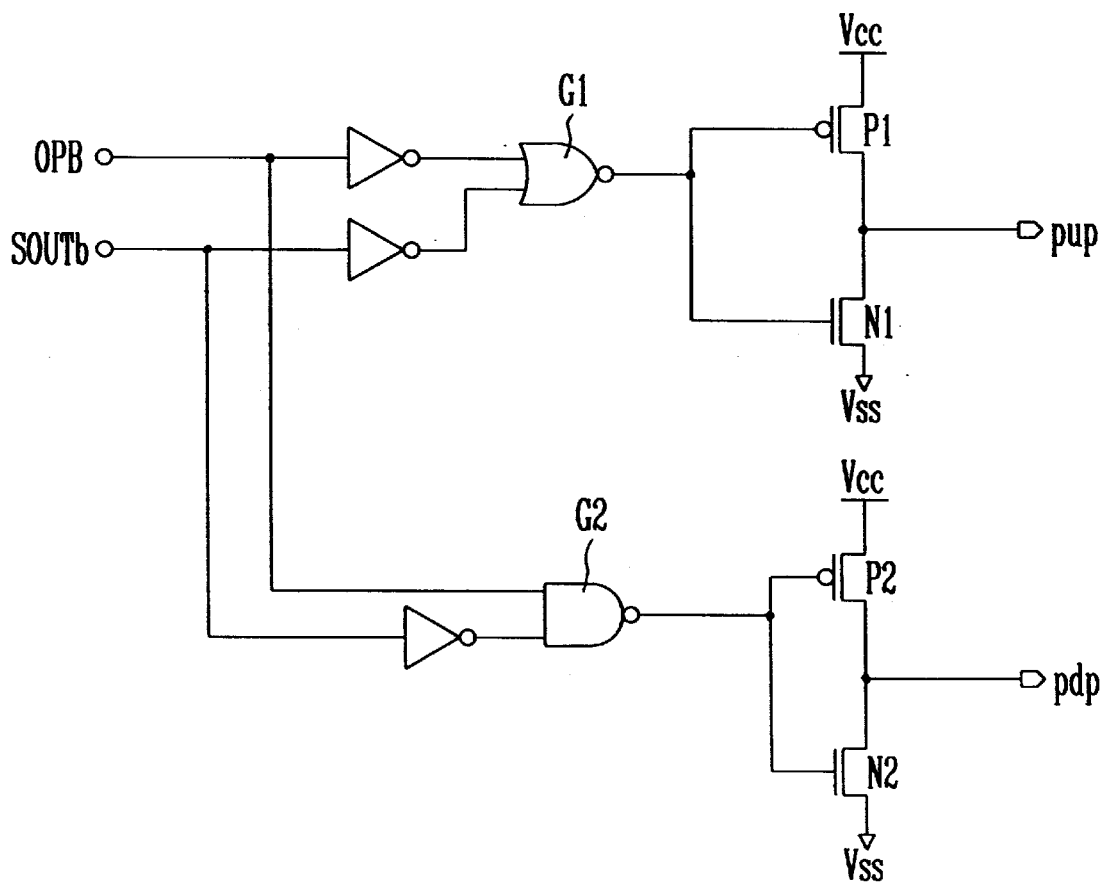
Figure 2A:
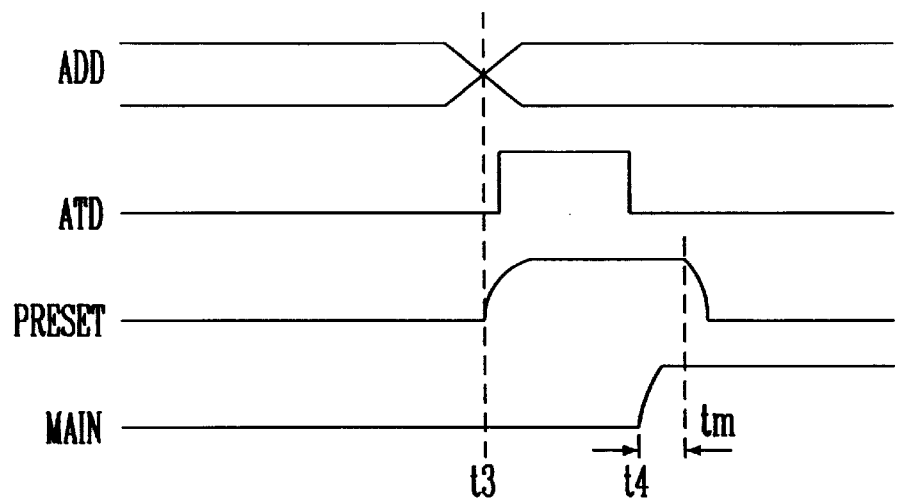
FIGS. 2a and 2b are timing diagrams of an output buffer according to the present invention and a preset signal generation circuit of the output buffer according to the present invention, respectively.
Figure 2B:
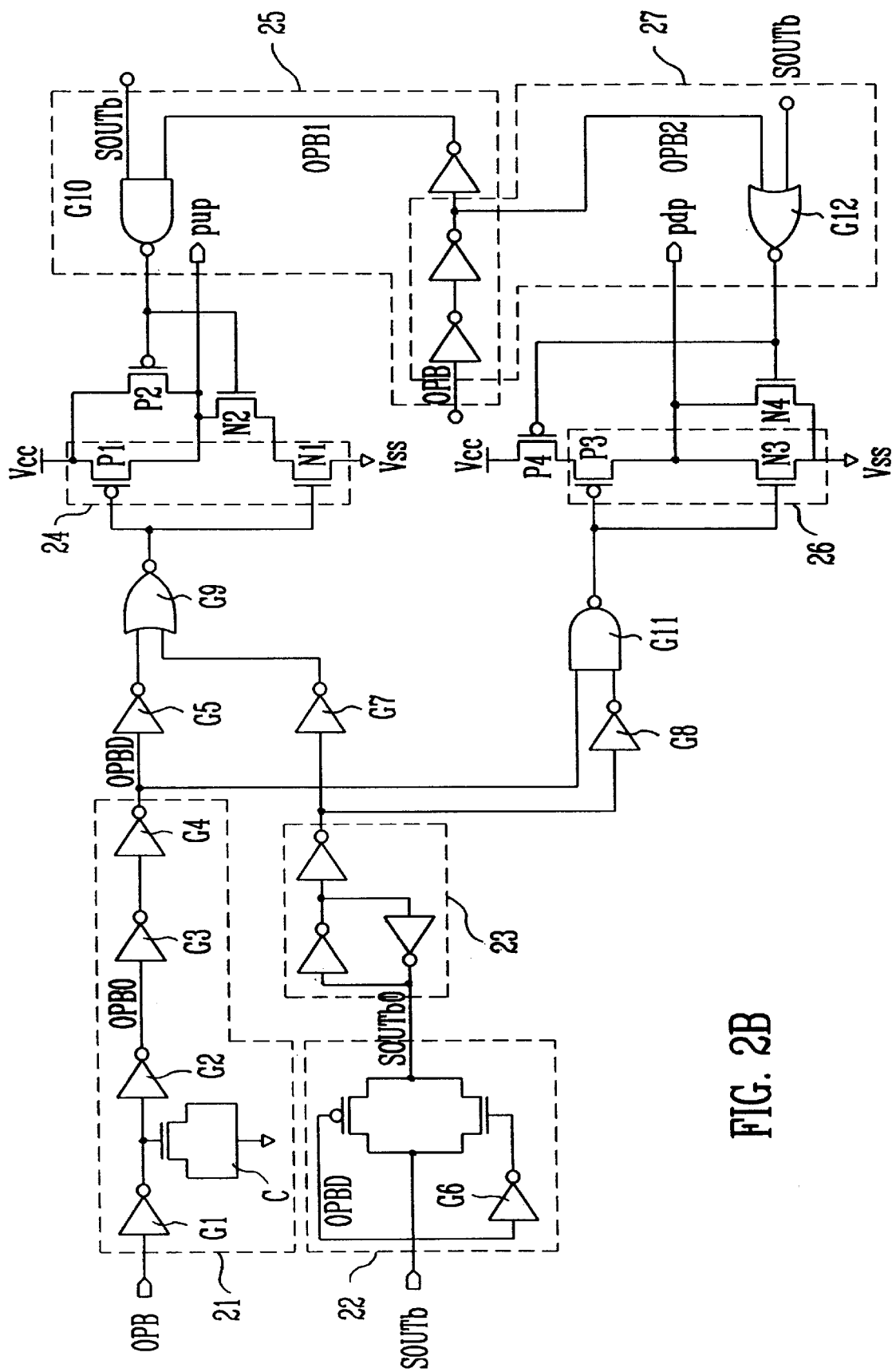

FIGS. 2a and 2b are timing diagrams of an output buffer according to the present invention and a preset signal generation circuit of the output buffer according to the present invention, respectively.

As shown in FIG. 2a, if an address ADD is changed at t3 time point of FIG. 2a to read data stored in a memory cell, an address transition detector ATD generates an ATD pulse having high state. The address transition detector is used for detecting the address at the time of read operation of memory cell, and the read speed of data can be improved and the power consumption can be reduced by using the ATD pulse generated by the ATD circuit. At this time, the preset signal PRESET generated by the preset signal generation circuit becomes high state so that the preset pull up or pull down transistor is turned on according to the state of previously sensed data so as to precharge the potential of the output node. Thereafter, the main pull up and pull down transistors are turned on according to a main pull up and pull down transistors drive signal MAIN so that the resultant data is output through the output terminal. At this time, the pulse width of the preset signal PRESET is made large so that, even after the main pull up and pull down transistor signal MAIN becomes high state, the preset signal PRESET overlaps the main pull up and pull down transistor drive signal MAIN for some extent of time tm and thereafter becomes low state.

In the case described above, since the preset signal PRESET and the main pull up and pull down transistor drive signal MAIN simultaneously have high state for some extent of time tm, the discontinuous flow of current can be prevented.

A procedure of generating such preset signal will be described below with reference to a circuit diagram of FIG. 2b.

A preset enable signal OPB is generated by using the ATD pulse, has a pulse width same as that of ATD pulse, and becomes high state at the time of driving the preset signal generation circuit. An input signal SOUTb is an inversed data of previously sensed data.

In the present invention, the preset enable signal OPB is input to a fifth inverter G5 after being delayed for a certain time(tm time of FIG. 2a) by a delay means 21 so that the preset signal PRESET has a wide pulse width. That is, the preset enable signal OPB which was input as high state becomes low state by a first inverter G1 and then is charged to a capacitor C connected to an output end of the first inverter G1. Thereafter, an output signal OPBO of a second inverter G2 becomes high state, however since the capacitor C is charged with charges, some extent of time is required (tm time of FIG. 2a) for the output signal OPBO of the second inverter G2 to be high state. Thus, the output signal OPBO of the second inverter G2 is delayed through third and fourth inverters G3 and G4. An output signal OPBD of the fourth inverter G4 maintains high state.

On the other hand, the previously sensed data signal SOUTb is input through a transfer gate 22 driven by the output signal OPBD and stored in a latch means 23. The previously sensed data signal SOUTb is input to the transfer gate 22 and latched before the preset signal generation circuit is enabled, that is, when the output signal OPBD is low state. The latch means 23 is composed of a pair of inverters, in which the output terminal of one inverter is connected to the input terminal of the other inverter, and an inverter which inverts an output of the pair of inverters. The latch means 23 is used for maintaining the previously sensed data during the occurrence of the present preset signal, since if the sensed data SOUTb varies during the occurrence of the preset signal it can cause a misoperation. That is, if the preset signal generation circuit is enabled, the signal OPBD becomes high state so that the transfer gate 22 is turned off, so the previously sensed data is maintained through the latch means 23 until the next data is preset.

Among the operation of the preset signal generation circuit which uses the delay of the signal OPBD and the latch function of the previously sensed data first, a case where the previously sensed data is low state, that is, a case where the input signal SOUTb is high state will be described.

In the pull up operation, the preset enable signal OPB is inverted through the delay means 21 and the fifth inverter G5 as described above and input to a first NOR gate G9. In addition, the input signal SOUTb being high state is inverted to low state through the transfer gate 22, latch means 23 and a seventh inverter G7 and input to the first NOR gate G9. Accordingly, the output of the first NOR gate G9 becomes high state so as to turn off a first PMOS transistor P1 of a first drive means 24 and turn on a first NMOS transistor N1 of a first drive means 24, whereby a current path occurs to a ground terminal Vss. Eventually, the level of output terminal pup becomes low state so as to turn on the preset pull up transistor.

At this time, the point to be considered is that in case where the address is changed so that the data to be sensed and output is at different level from before, the preset is continuously carried out, however in case where the sensed data same as before is output, the preset must be stopped. For this, the present invention uses a first preset signal control means 25 which has as inputs the preset enable signal OPB and the previously sensed data.

That is, the preset enable signal OPB is inverted to low state through inverters G31, G32 and G33. An output OPB1 of the inverter G33 is input to an input terminal of a first NAND gate G10, while the sensed data SOUTb being high state is input to another input terminal of the first NAND gate G10, whereby an output of the first NAND gate G10 becomes high state.

Since the preset enable signal OPB is generated prior to generation of the signal OPBD, while the first NMOS transistor N1 is turned on by the signal OPBD and the previously sensed data SOUTb being high state so that the preset pull up transistor is turned on by an output terminal pup having low state so that the preset is performed, the preset enable signal OPB becomes low state so that the output of the NAND gate G10 of the first preset signal control means 25 becomes low state. The output of the NAND gate G10 turns on the second PMOS transistor P2 and turns off the second NMOS transistor N2.

Thus, if the second PMOS transistor P2 is turned on, the output terminal pup becomes high state, whereby the preset pull up transistor is turned off so that the preset signal generation circuit is disabled.

On the other hand, the preset enable signal OPB is delayed through the delay means 21 as described above and then input to a second NAND gate G11. In addition, the previously sensed data SOUTb being high state is inverted to low state through the transfer gate 22, latch means 23 and an eighth inverter G8 and input to the second NAND gate G11. Accordingly, the output of the second NAND gate G11 becomes high state so as to turn off a third PMOS transistor P3 of the second drive means 26 and turn on a third NMOS transistor N3 of the second drive means 26, whereby a current path occurs to the ground terminal Vss. Eventually, the level of output terminal pdp becomes low state so as to turn off the preset pull down transistor.

Next, a case where the previously sensed data is high state, that is, a case where the input signal SOUTb is low state will be described.

First, the preset enable signal OPB is inverted through the delay means 21 and the fifth inverter G5 and input to the first NOR gate G9. In addition, the input signal SOUTb being low state is inverted to high state through the transfer gate 22, latch means 23 and the seventh inverter G7 and input to the first NOR gate G9. Accordingly, the output of the first NOR gate G9 becomes low state so as to turn on the first PMOS transistor P1 of the first drive means 24 and turn off the first NMOS transistor N1 of the first drive means 24, whereby the source voltage is input through the first PMOS transistor P1. Eventually, the level of output terminal pup becomes high state so as to turn off the preset pull up transistor.

On the other hand, the preset enable signal OPB being high state is delayed through the delay means 21 and then input to the second NAND gate G11. In addition, the input signal SOUTb being low state is inverted to high state through the transfer gate 22, latch means 23 and an eighth inverter G8 and input to the second NAND gate G11. Accordingly, the output of the second NAND gate G11 becomes low state so as to turn on the third PMOS transistor P3 of the second drive means 26 and turn off the third NMOS transistor N3 of the second drive means 26, whereby the source voltage Vcc is input through the first PMOS transistor P1. Eventually, the lever of output terminal pdp becomes high state so as to turn on the preset pull down transistor.

At this time, the point to be considered is that in case the address is changed so that the data to be sensed and output is at different level from before, the preset is continuously carried out, however in case where the sensed data same as before is output, the preset must be stopped. For this, the present invention uses a second preset signal control means 27 which has as inputs the preset enable signal OPB and the previously sensed data.

That is, an output of a second NOR gate G12, which has as inputs the signal OPB2 which has become high state through a plurality of inverters G30 and G31 and the previously sensed data SOUTb being low state, becomes low state. This turns on a fourth PMOS transistor P4 and turns off the fourth NMOS transistor N4 so that the output terminal pdp maintains high state.

Since the preset enable signal OPB is generated prior to generation of the signal OPBD, while the preset pull down transistor is turned on by the signal OPBD and the previously sensed data SOUTb being low state so that the preset is performed, the preset enable signal OPB becomes low state that the output of the second NOR gate G12 of the preset control means 27 becomes high state, This turns off the fourth PMOS transistor P4 and turns on the fourth NMOS transistor N4. As the fourth PMOS transistor P4 is turned off, the output terminal pdp becomes low state, and accordingly the preset pull down transistor is turned off so as to stop the preset.

Thereafter, the output signal of the output terminals pup and pdp of such preset signal generation circuit is input to the output driver, and since the preset signal is generated by delaying and inputting the preset enable signal OPB, even after the main pull up and pull down circuit is driven(t4 time point of FIG. 2a), the preset pull up or the pull down transistor is driven together with the main pull up and pull down circuit for some extent of time(tm time of FIG. 2a), so that the driving force is large and there is no discontinuity in the flow of current so as to improve the data output speed.

Figure 3:
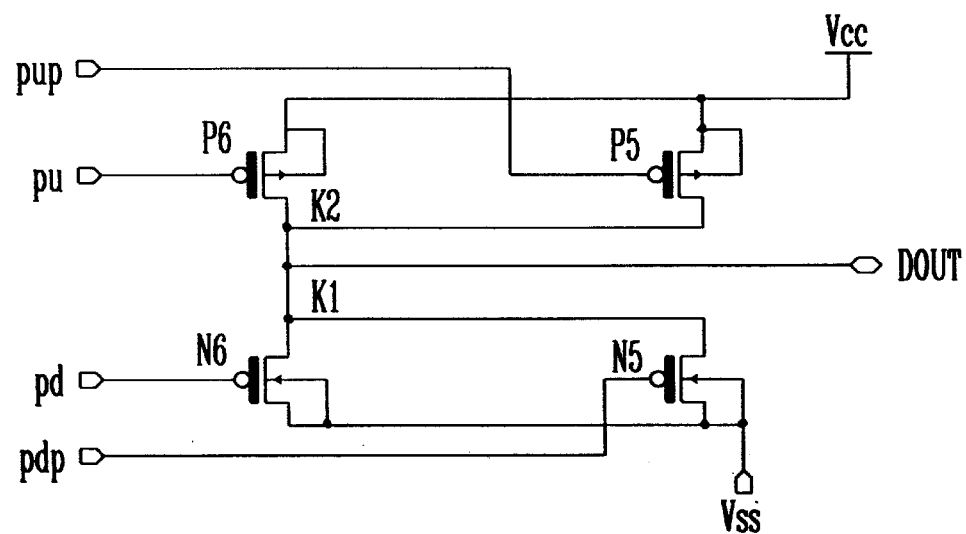
FIG. 3 is a circuit diagram of an output driver of the output buffer which is applied to the present invention.

FIG. 3 is a circuit diagram of an output driver applied to the present invention.

In case where the previously sensed data is high, that is, in case the input signal SOUTb of the preset signal generation circuit is low, the level of output terminals pup and pdp of the preset signal generation circuit becomes high so that a preset pull up down transistor P5 is turned off and a preset pull down transistor N5 is turned on so that the electric path occurs to the ground terminal Vss and a node K1 becomes low state. Thereafter, before the preset pull down transistor N5 is turned off, a main pull down transistor N6 is turned on (t4 time point of FIG. 2a) by the main pull up and pull down signal generation circuit so that the current path occurs to the ground terminal Vss so that the node K1 becomes further enforced low state and eventually the data of low level is output to the output terminal DOUT.

On the other hand, in case where the previously sensed data is low, that is, in case the input signal SOUTb of the preset signal generation circuit is high, the level of output terminal pup and pdp of the preset signal generation circuit becomes low so that the preset pull up transistor P5 is turned on and the preset pull down transistor N5 is turned off. Accordingly, the node K2 becomes high state. Before the preset pull down transistor P5 is turned off, a main pull up transistor P6 is turned on by the main pull up and pull down signal generation circuit so that the node K2 becomes further enhanced high state and eventually At he data of high level is output to the output terminal DOUT.

Figure 4:
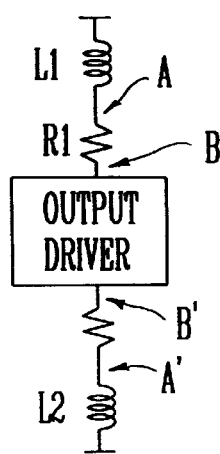
FIG. 4 is a functional diagram to illustrate positions of measurement of noise and electric current of the output buffer.

FIG. 4 is a functional diagram to illustrate noise and electric current measurement points. when a resistor R1 and R2 of 1 ohm and an inductor L1 and L2 of 120 nH are connected to each of the ends of an output driver, the influence of noise is measured at points A and A' between resistors R1 and R2 and inductors L1 and L2. The flow of electric current is measured at points B and B' between the output driver and resistors R1 and R2. The degrees of noise and electric current measured as described above are presented in graphs of FIGS. 6 and 7, respectively.

Figure 5:
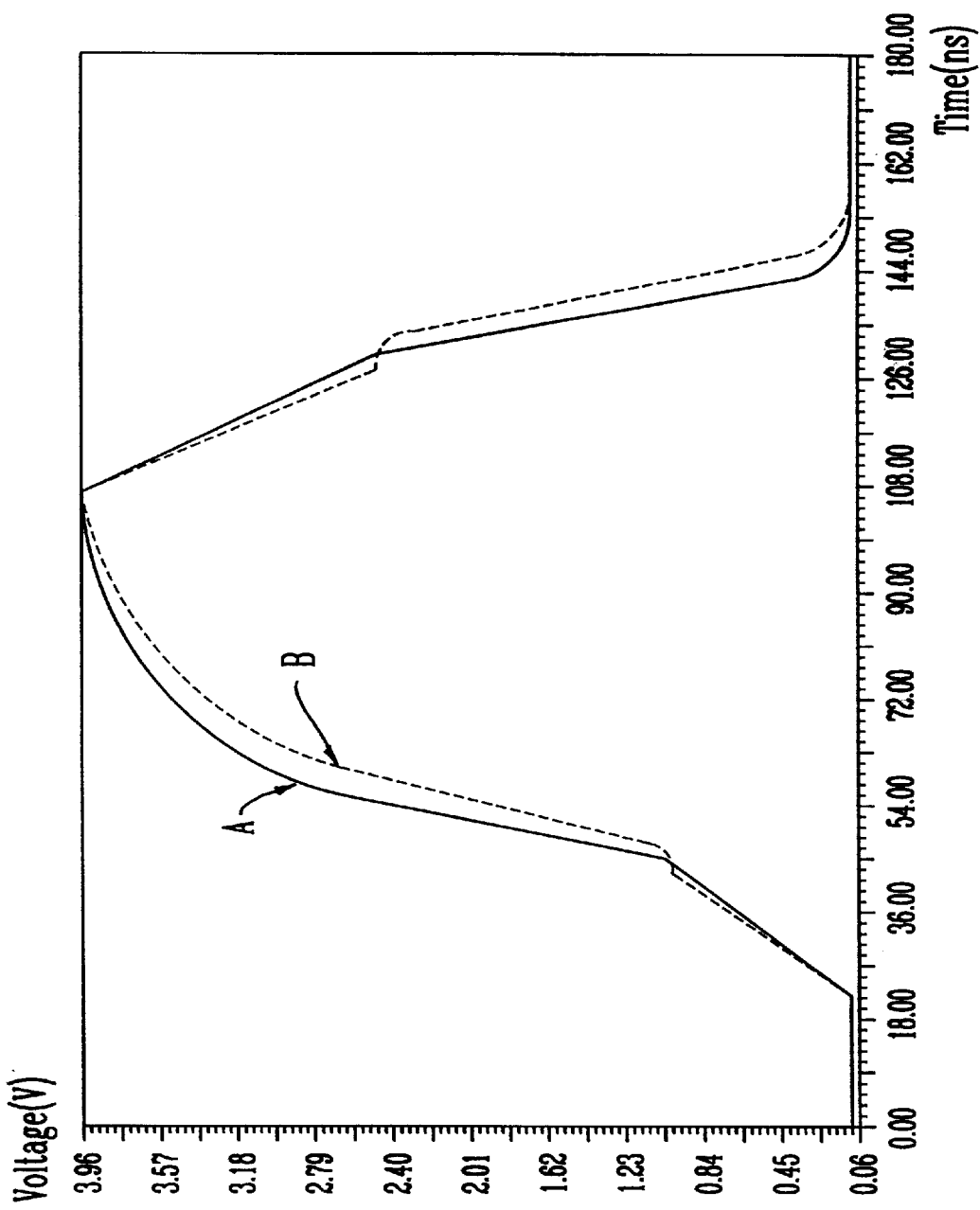
FIG. 5 is a graph showing the measurement of data output speed of the output buffer according to the preset signal generation circuit.

FIG. 5 is a graph illustrating the data output speed of the output buffer according to the preset signal generation circuit.

As shown in the drawing, it can be seen that if the preset signal generation circuit according to the present invention is used(case A), the data is output at the speed 2.0 ns faster in pull up process and 2.5 ns faster in pull down process than using the conventional preset signal generation circuit(case B). This is because the drive force is improved by turning on the main pull up and pull down transistor together with the preset pull up and pull down transistor before the latter is turned off.

Figure 6B:
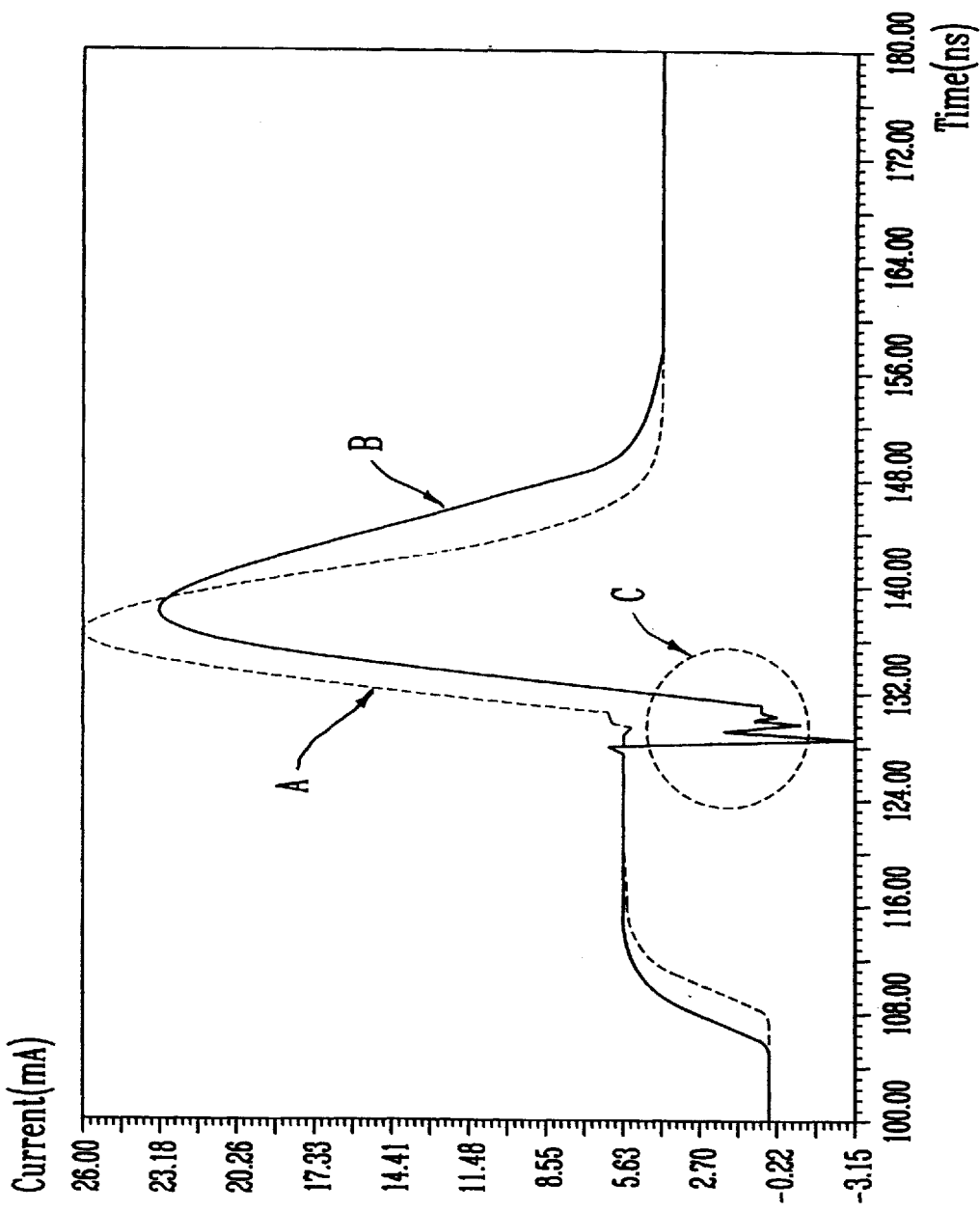

FIGS. 6a and 6b are graphs presenting flows of electric currents according to the preset signal generation circuit at the time of pull up and pull down, respectively.

FIG. 6a is a graph showing the measurements of electric current flow at the time of pull up, from which it can be seen that discontinuity C (a position where about 45 ns elapsed) occurs in the electric current flow since the main pull up transistor is turned on after the preset pull up transistor is turned off in case of using the conventional preset signal generation circuit(case B). To the contrary, the problem of discontinuity of electric current can be solved by turning on the preset pull up transistor together with the main pull up transistor for a constant time in case(case A) of using the preset signal generation circuit of the present invention, whereby the data output speed can be improved.

FIG. 6b is a graph showing the measurements of electric current flow at the time of pull down, from which it can be seen that, similar to the pull up process of FIG. 6a, discontinuity C(a position where about 128 ns elapsed) occurs in the electric current flow in case of using the conventional preset signal generation circuit(case B), however such problem can be solved in case(case A) of using the preset signal generation signal according to the present invention.

FIGS. 7a and 7b are graphs presenting the measurements of noise degree according to the preset signal generation circuit at the time of pull up and pull down, respectively.

FIG. 7a is a graph presenting the measurements of noise degree at the time of pull up process, from which it can be seen that a lot of noise occurs at the position(C; the position where about 45 ns elapsed) where the electric current discontinuously flows in FIG. 6a in case of using the conventional preset signal generation circuit(case B). However, it can be seen that the noise influence is remarkably improved in case (case A) of using the preset signal generation circuit according to the present invention.

FIG. 7b is a graph presenting the measurements of noise degree at the time of pull down process, from which it can be seen that a lot of noise occurs at the position(C; the position where about 128 ns, elapsed) where the electric current discontinuously flows in FIG. 6b in case of using the conventional preset signal generation circuit(case B). However, it can be seen that the noise influence is remarkably improved in case (case A) of using the preset signal generation circuit according to the present invention.

EFFECT OF THE INVENTION

According to the present invention as described above, by delaying and inputting the preset enable signal, the discontinuous flow of electric current at the position of completion of preset process is prevented, and the data output speed is improved and the noise can be reduced.

What is claimed is:

1. A preset type output buffer comprising a preset signal generation circuit, a main pull up and pull down signal generation circuit, and an output driver driven according to the output signals of said preset signal generation circuit and main pull up and pull down signal generation circuit, in which said preset signal generation circuit comprises:

a transfer gate for transferring a previously sensed data according to a delayed preset enable signal before said preset signal generation circuit is enabled;

delay means for outputting a delayed preset enable signal by delaying said preset enable signal;

latch means for storing an output signal of said transfer gate;

a first logic element for combining an inverted signal of said delayed preset enable signal and an inverted output signal of said latch means;

a first drive means for outputting a source voltage or a ground voltage according to an output signal of said first logic element;

a first preset signal control means for controlling an output of said first drive means by having as inputs said preset enable signal and said previously sensed data;

a second logic element for combining said delayed preset enable signal and an inverted output signal of said latch means;

a second drive means for outputting said source voltage or ground voltage according to an output of said second logic element; and a second preset signal control means for controlling an output of said second drive means by having as inputs said preset enable signal and said previously sensed data.

2. The output buffer circuit of claim 1, wherein said delay means comprises:

a first inverter for inverting said delayed preset enable signal;

a capacitor for charging a voltage according to an output of said first inverter; and a second inverter for inverting a voltage charged to said capacitor.

3. The output buffer circuit of claim 1, wherein said transfer gate comprises a first PMOS transistor and a first NMOS transistor driven according to said preset enable signal.

4. The output buffer circuit of claim 1, wherein said latch means comprises:

first and second inverters taking as an input the output signal of said transfer gate and an output of one inverter being connected to an input of the other inverter; and a third inverter for inverting an output signal of said inverters.

5. The output buffer circuit of claim 1, wherein said first preset signal control means comprise:

an inverter means for inverting said preset enable signal an odd number of times;

a first NAND gate having as inputs an output of said inverter and said previously sensed data; and a second PMOS transistor and a second NMOS transistor driven according to an output of said NAND gate.

6. The output buffer circuit of claim 1, wherein said second present signal control means comprises:

an inverter means for inverting said preset enable signal an even number of times;

a first NOR gate having as inputs an output of said inverter and said previously sensed data; and a third PMOS transistor and a third NMOS transistor driven according to an output of said NOR gate.

7. A preset type output buffer circuit comprising a preset signal generation circuit, a main pull up and pull down signal generation circuit, and an output driver driven according to the output signals of said preset signal generation circuit and said main pull up and pull down signal generation circuit, in which said preset signal generation circuit comprises:

a delay circuit having an input which receives a preset enable signal and an output which provides a delayed preset enable signal;

a transfer circuit having a first input which receives a previously sensed data signal, and an output which provides said previously sensed data signal in response to said delayed preset enable signal, before said preset signal generation circuit is enabled;

a latch circuit having an input connected to the output of the transfer circuit, and an output which produces said previously sensed data signal until a predetermined condition is met;

a first logic circuit having a first input which receives a signal output by the delay circuit, a second input which receives a signal output by the latch circuit, and an output;

a first driver having an input which receives a signal output by the first logic circuit, the first driver configured to output a source voltage or a ground voltage, in response to the output of the first logic circuit;

a first preset signal control circuit having a first input which receives said preset enable signal, and a second input which receives said previously stored data, the first preset signal control circuit having an output configured to control said first driver;

a second logic circuit having a first input which receives a signal output by the delay circuit, a second input which receives a signal output by the latch circuit, and an output;

a second driver having an input which receives a signal output by the second logic circuit, the second driver configured to output a source voltage or a ground voltage, in response to the output of the second logic circuit; and a second preset signal control circuit having a first input which receives said preset enable signal, and a second input which receives said previously sensed data, the second preset signal control circuit having an output configured to control said second driver.

8. The output buffer circuit of claim 7, wherein said delay circuit comprises:

a first inverter for inverting said preset enable signal;

a capacitor for charging a voltage according to an output of said first inverter; and a second inverter for inverting a voltage charged to said capacitor.

9. The output buffer circuit of claim 7, wherein said transfer circuit comprises a first PMOS transistor and a first NMOS transistor driven according to said delayed preset enable signal.

10. The output buffer circuit of claim 7, wherein said latch circuit comprises:

a first inverter having an input connected to the output of the transfer circuit, and an output;

a second inverter having an input connected to the output of the first inverter, and an output connected to the input of the first inverter; and a third inverter having an input connected to the output of the first inverter, and an output.

11. The output buffer circuit of claim 7, wherein said first preset signal control circuit comprises:

an inverter circuit for inverting said preset enable signal an odd number of times;

a first NAND gate having, as inputs, an output of said inverter circuit and said previously sensed data; and a PMOS transistor and an NMOS transistor driven according to an output of the first NAND gate.

12. The output buffer circuit of claim 7, wherein said second preset signal control circuit comprises:

an inverter circuit for inverting said preset enable signal an even number of times;

a first NOR gate having, as inputs, an output of said inverter circuit and said previously sensed data; and a PMOS transistor and a NMOS transistor driven according to an output of said first NOR gate.

13. The output buffer circuit according to claim 7, wherein the first logic circuit comprises a NOR gate and the second logic circuit comprises a NAND gate.

14. The output buffer circuit according to claim 7, wherein the signal received by the first input of the first logic circuit is an inverted version of the signal output by the delay circuit;

the signal received by the second input of the first logic circuit is an inverted version of the signal output by the latch circuit; and the signal received by the second input of the second logic circuit is an inverted version of the signal output by the latch circuit.

15. The output buffer circuit according to claim 14, wherein the first logic circuit comprises a first NOR gate and the second logic circuit comprises a first NAND gate.

16. The output buffer circuit of claim 15, wherein said first preset signal control circuit comprises:

an inverter circuit for inverting said preset enable signal an odd number of times;

a second NAND gate having, as inputs, an output of said inverter circuit and said previously sensed data; and a PMOS transistor and an NMOS transistor driven according to an output of the second NAND gate.

17. The output buffer circuit of claim 16, wherein said second preset signal control circuit comprises:

an inverter circuit for inverting said preset enable signal an even number of times;

a second NOR gate having, as inputs, an output of said inverter circuit and said previously sensed data; and a PMOS transistor and a NMOS transistor driven according to an output of said second NOR gate.

* * * * *